US006396347B1

(12) United States Patent
Lie et al.

(10) Patent No.: US 6,396,347 B1
(45) Date of Patent: May 28, 2002

(54) LOW-POWER, LOW-NOISE DUAL GAIN AMPLIFIER TOPOLOGY AND METHOD

(75) Inventors: Donald Y. Lie, San Diego; Lawrence E. Larson, Del Mar, both of CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/848,855

(22) Filed: May 3, 2001

(51) Int. Cl.[7] .................................................. H03G 3/10
(52) U.S. Cl. ....................................... 330/285; 330/133
(58) Field of Search ................................ 330/133, 134, 330/285, 311, 300, 51, 129, 295, 84

(56) References Cited

U.S. PATENT DOCUMENTS

| | | | | |
|---|---|---|---|---|
| 2,761,019 A | * | 8/1956 | Hall ............................ | 179/171 |
| 3,470,486 A | * | 9/1969 | Beelitz ........................ | 330/30 |
| 3,513,404 A | * | 5/1970 | Gilbert et al. .................. | 330/9 |
| 4,025,871 A | * | 5/1977 | Peil ............................. | 330/22 |
| 6,144,254 A | | 11/2000 | Irvine et al. | |

OTHER PUBLICATIONS

Deiss, A., et al., "A 200–MHz Sub–mA RF Front End for Wireless Hearing Aid Applications," IEEE Journal of Solid–State Circuits, vol. 35, No. 7 Jul. 2000, pp. 977–984, USA.

Long, J.R., et al., "RF Analog and Digital Circuits in SiGe Technology," IEEE International Solid State Circuits Conference Digest of Technical Papers, 1996, pp. 82–83,423, USA No month.

* cited by examiner

Primary Examiner—Benny T. Lee
Assistant Examiner—Henry Choe
(74) Attorney, Agent, or Firm—Blakely, Sokoloff, Taylor & Zafman LLP

(57) ABSTRACT

In a low-heightened power, low-heightened noise dual gain amplifier, first and second, transistors have their emitter-collector circuits connected in series between the ground and a bus voltage. A radio frequency input terminal is coupled to the bases of both transistors. The first transistor is connected across the ground and an output terminal and operated in the common emitter mode. The first transistor operates as a high gain amplifier. A second transistor is connected across the output terminal and a bus voltage. First and second switching transistors switch first and second biasing sources to render first and second amplifier transistors conducted for operation in the high gain or low gain mode. Additionally, a third switching transistor is ac coupled across the input terminals of the first and second amplifier transistors. The third switching transistor is biased along with the first switching transistor for selectively coupling the RF input to the high gain or low gain amplifying transistor.

10 Claims, 6 Drawing Sheets

|    | Vcc (V) | Idc (mA) | Pdc (mW) | NF    | Gain (@950MHz) | IIP3   | S12 | S11 | S22 |
|----|---------|----------|----------|-------|----------------|--------|-----|-----|-----|
| HG | 1       | 2.8      | 2.8      | 1.579 | 9.573          | 2 to 4 | -19 | -14 | -12 |
| LG | 1       | 1.7      | 1.7      | 8.1   | -9.4           | 3 to 5 | -10 | -10 | -10 |

FIG. 10

LOW-POWER, LOW-NOISE DUAL GAIN AMPLIFIER TOPOLOGY AND METHOD

FIELD OF THE INVENTION

The present invention relates to dual gain semiconductor amplifiers and more particularly to a method and means for providing low-power, low-noise operation.

BACKGROUND IN THE ART

The present invention is discussed in the context of a high frequency (e.g. 900 MHz). It is discussed in this context since it provides readily appreciable benefits, but is useful in transceiver applications. One such particular application is radio frequency links in general. One such application is a radio frequency hearing aid product. An example of such a prior art product is found at Deiss, A et al., A 200 MHz Sub-mA RF Front End For Wireless Hearing Aid Applications, IEEE Journal of Solid-State Circuits, Vol. 35 No. 7 July 2000, pp. 977–985. In this article, a hearing aid system with a radio frequency connection between both ear pieces is described. The transceiver in this example has a desired power dissipation of 2–3 mW. The authors report that a 900 MHz radio frequency low-noise amplifier front-end would be preferable. Use of a 900 MHz frequency permits the use of a physically smaller antenna and off-chip components for the ear link. However, the authors also report that it is extremely difficult to have a dual gain low-noise amplifier that only dissipates 2–3 mW at higher frequencies such as 900 MHz and beyond.

SUMMARY OF THE INVENTION

It is therefore the object of the present invention to provide an amplifier topology providing for low-power, low-noise operation over a significant range of frequencies useful for RF links.

It is also the object of the present invention to provide a method for efficiently and effectively multiplying a radio frequency signal by a low or high gain factor. It is a particular object of the present invention in one form to provide low-noise dual gain amplifier of the type described that only dissipates 2–3 mW at higher frequencies such as 900 MHz and beyond.

In accordance with the present invention, there is provided a circuit topology in which a first amplifier transistor is connected in the common emitter mode for operation in a high gain mode and a second amplifier is connected in the common collector configuration for operation in a low gain mode low gain amplification. The collector-emitter circuits of the low gain and high gain amplifier transistors are AC coupled in series between a bus voltage and ground. Biasing means connected to the bases of each transistor bias the transistors to opposite states of conductivity. An additional switching means is AC coupled between a radio frequency input signal terminal to one amplifier input and rendered conductive or non-conductive in accordance with the gain mode. According to the method of the present invention, the radio frequency signal is amplified selectively by the low gain or high gain amplifier described above.

BRIEF DESCRIPTION OF THE DRAWINGS

The means and method by which the foregoing objects and features of invention are achieved are pointed out in the claims forming the concluding portion of the specification. The invention, both as to its organization and method of operation, may be further understood by the following description taken in connection with the following drawings.

FIG. 10 is a chart which is a summary of circuit simulation results for high gain and low gain modes.

DETAILED DESCRIPTION OF THE INVENTION

Figure 1:
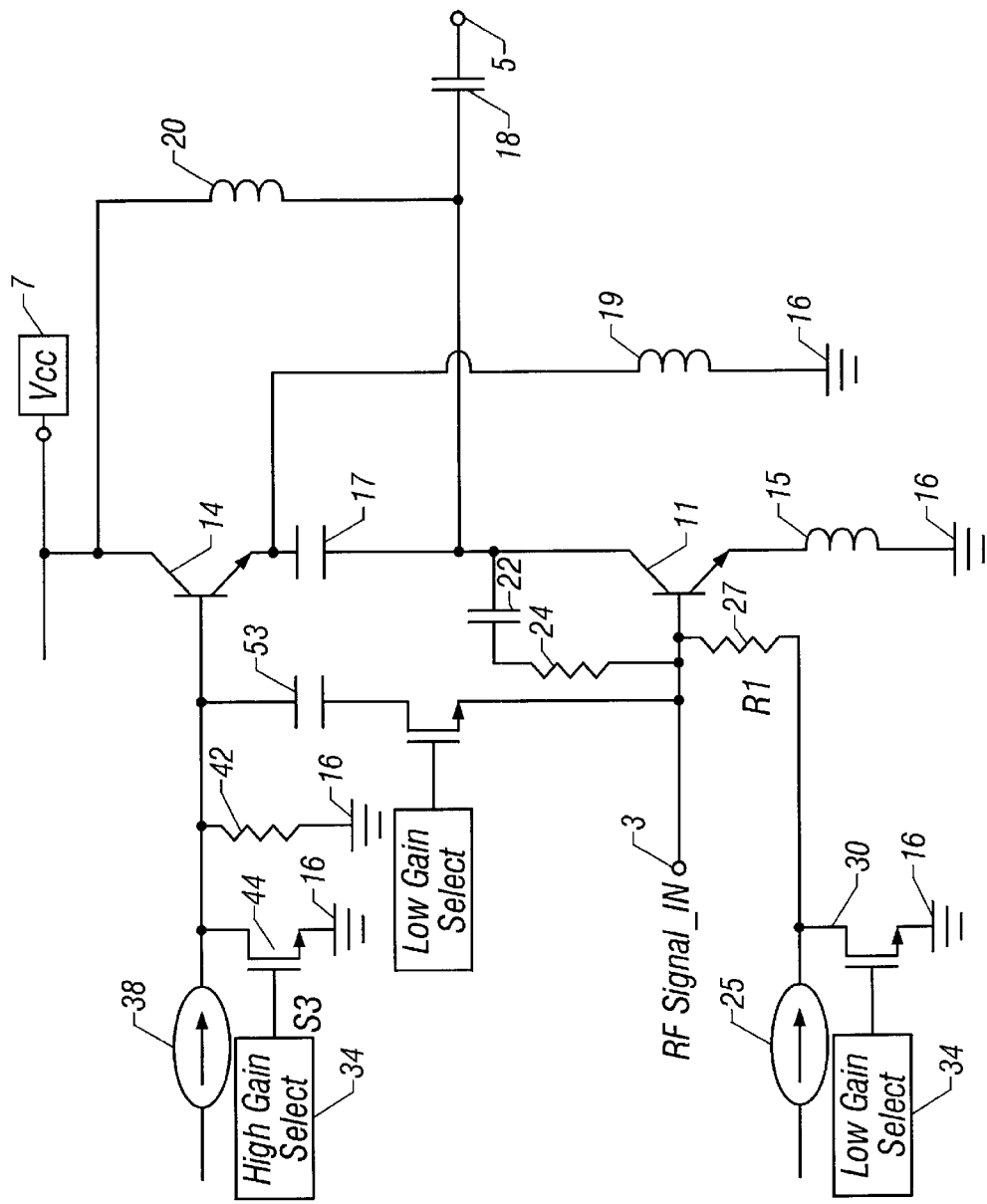
FIG. 1 is a schematic illustration of a dual gain amplifier constructed in accordance with the present invention.

FIG. 1 is a schematic diagram of a low-noise, low-power amplifier 1 constructive in accordance with the present invention. The topology of the present invention necessarily provides for low-power, low-noise, stable operation. The amplifier 1 has an input port 3 at which a radio frequency signal input is provided. The amplifier 1 also has an output port 5 at which an amplified output at a selected gain level is provided. A first amplifier transistor 11 is connected in the common emitter mode and utilized as a high gain amplifying transistor. Similarly, a second amplifier transistor 14 is connected in the common collector mode and comprises a low gain amplifier transistor. A radio frequency input at input port 3 is provided to the inputs, or bases of the amplifier transistors 11 and blocking capacitor 18.

The amplifier transistor 11 has its collector coupled via a DC to the output port 5 and its emitter coupled by a degenerative inductor 15 to a reference level, namely ground 16. A capacitor 22 and resistor 24 are connected in series across the base-collector circuit of the amplifier transistor 11 to provide a conventional feedback loop. The amplifier transistor 14 has its emitter connected to a bus voltage $V_{cc}$ source 7. The emitter of the amplifier transistor 14 is AC coupled via the DC blocking capacitor 18 to the output port 5. The emitter of the amplifier transistor 14 is coupled be a degenerative inductor 19 to ground 16. The emitter of the amplifier transistor 14 is coupled by a load inductor 20 and the capacitor 18 to the output port 5. While various types of transistors may be used, it is preferred that the first and second amplifier transistors 11 and 14 comprise HBT, or Heterojunction bi-polar, transistors. Heterjunction bi-polar transistors provide superior gain in comparison to their homojunction counterparts.

In order to bias the first amplifier transistor 11, a first bias source 25 is provided, which is coupled by a biasing transistor 27 to the base of the amplifier transistor 11. In order to provide for activation to the conductive state or inactivation of the amplifier transistor 11, a first switching transistor 30 is connected across the bias source 25. More specifically, a first switching transistor 30 has its source connected to the output of bias source 25, its drain connected to ground 16, and its gate connected to a switch biasing means 34. In order to select the conductive state of the amplifier transistor 11, the switch biasing means 34 provides a voltage to turn the first switching transistor 30 off when the first amplifier transistor 11 is to be turned on and to turn the first switching transistor 30 on when the first amplifier transistor 11 is to be turned off.

In order to bias the second amplifier transistor 14, a second bias source 38 is connected to the base of the second amplifier transistor 14. A biasing resistor 42 is connected across the second bias source 38. Also, a second switching transistor 44 is provided connected across the second biasing source 38. More specifically, the second switching transistor 44 has its source connected to the second bias DC source 38 and its drain connected to ground 16. The gate of the second switching transistor 44 is connected to the switch biasing means 34, which provides an output to turn the second switching transistor 44 on when the first switching transistor 30 is turned off and to turn the second switching transistor 44 off when the first switching transistor 30 is turned on. Turning on the first switching transistor 30 or the second switching transistor 44 lowers the potential applied to the first switching transistor 11 or the second switching transistor 14 respectively. Since in the present embodiment, the amplifier transistors 11 and 14 are N-P-N transistors, they each turn off when the potential to the base goes below that at the emitter.

Additionally, a third switching transistor 50 is provided connected in series with a DC blocking capacitor 53 between the base of the first amplifier transistor 11 and the base of the second amplifier transistor 14. The switch bias source 34 is connected to apply the same potential level to the third switching transistor 50 as to the first switching transistor 30. The third switching transistor 50 is off in the high gain mode when the first amplifier transistor 11 is activated, and is on when the first switching transistor 11 is biased off and the second amplified transistor 14 is biased on. In the preferred embodiment, the first second and third switching transistors 30, 44 and 50 are MOSFETs (metal oxide semi-conductor field effect transistors). MOSFETs are preferred since they act as virtually ideal switches.

Operation

Figure 2:
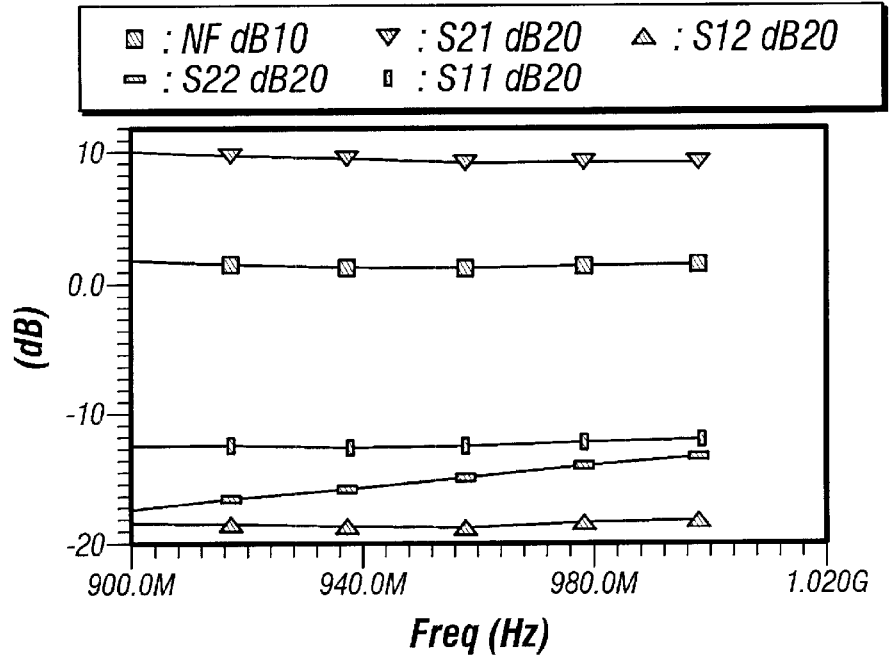
FIG. 2 is a semi-log chart with the abscissa frequency and the ordinate being decibels, of noise factor and S parameters for the present circuit at high gain.
Figure 3:
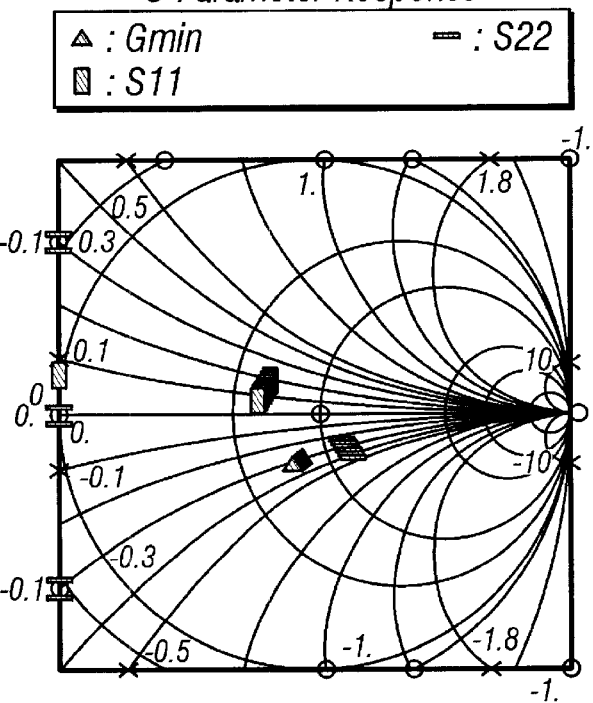
FIG. 3 is a Smith Chart demonstrating parameter response for input reflection coefficient and output reflection coefficient.
Figure 4:
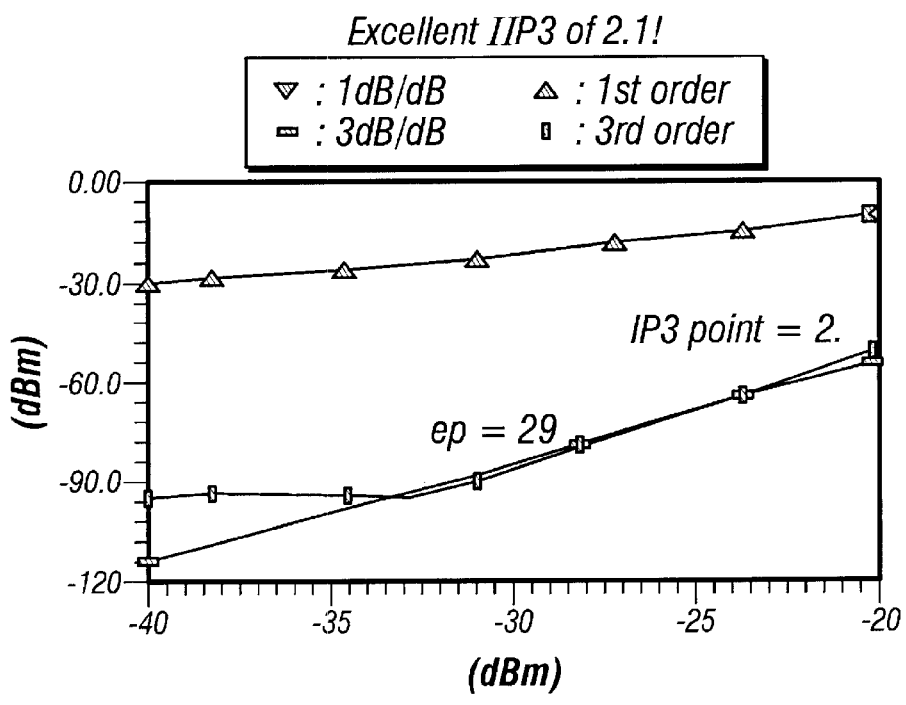
FIG. 4 is a semi-log chart in which the abscissa is frequency and the ordinate is in decibels illustrating third order intercept point.
Figure 5:
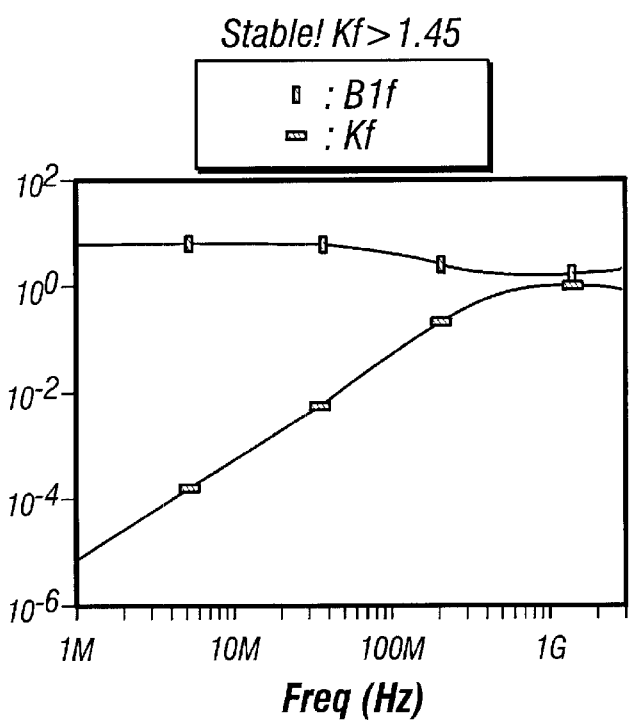
FIG. 5 is a similar semi-log chart of K factor.
Figure 6:
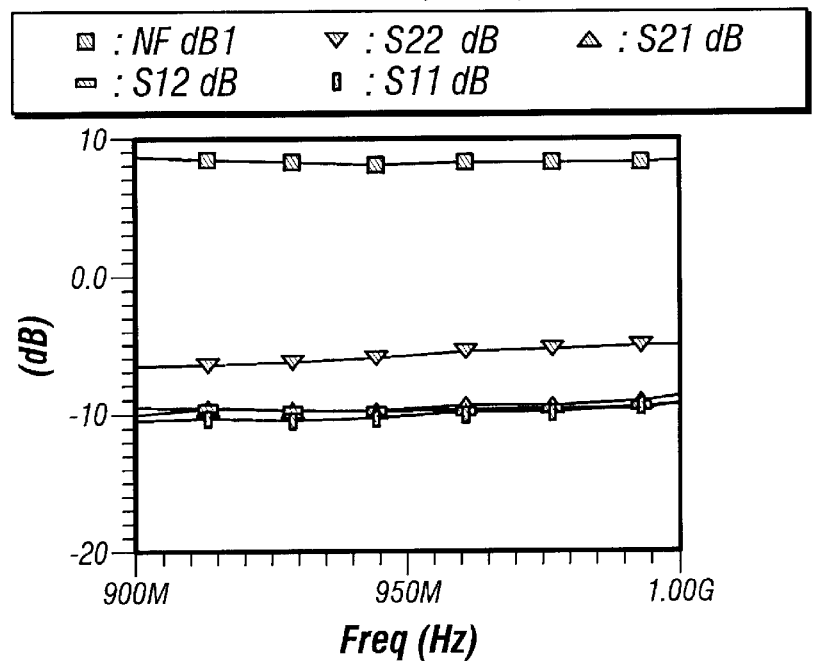
FIGS. 6–9 are charts illustrating characteristics for the high gain mode corresponding to FIGS. 2–5.
Figure 7:
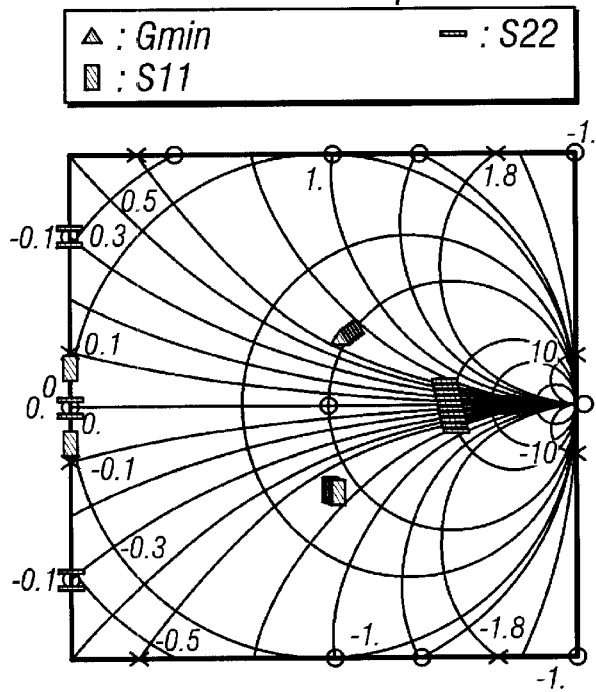
Figure 8:
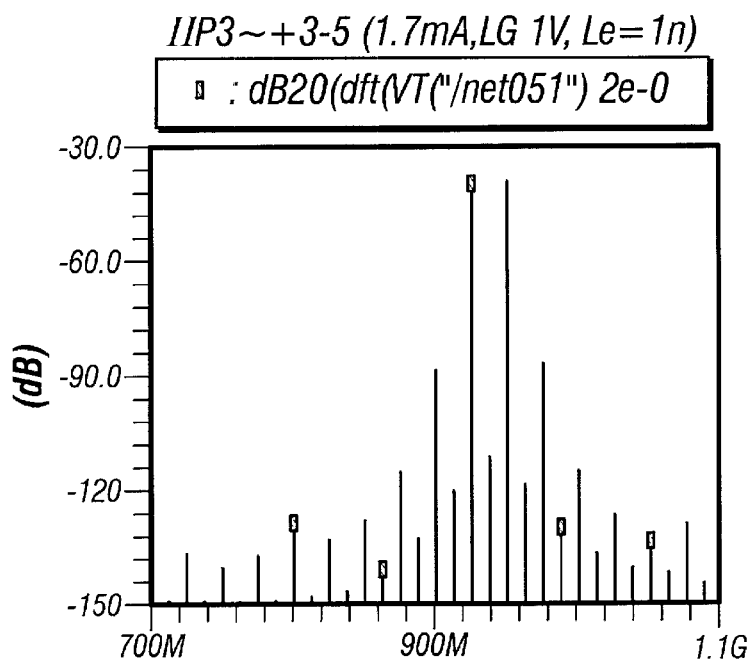
Figure 9:
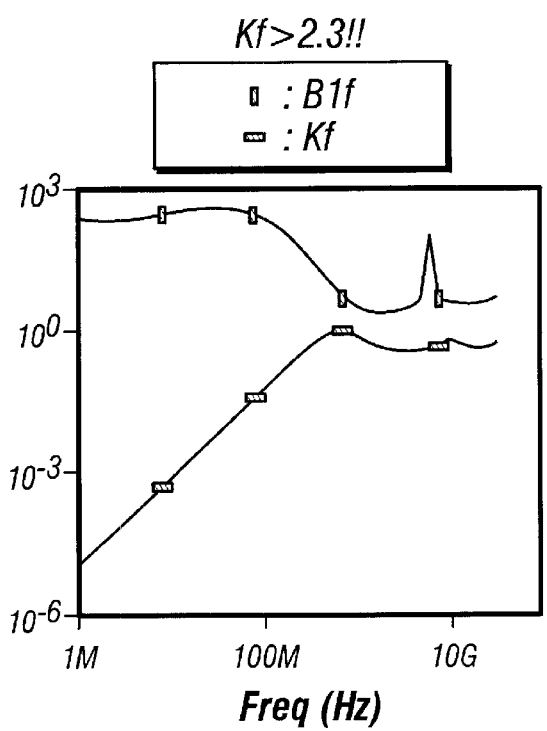

To operate the amplifier 1 in the high gain mode, the second switching transistor 44 is turned on, and the first and third switching transistors 30 and 50 are turned off. The first amplifier transistor 11 turned on and act as a single-transistor common-emitter amplifier. The single-transistor common-emitter amplifier topology provides highest radio frequency gain, low noise and good stability. A single transistor topology is preferred to a cascode topology which has limited "headroom." A transistor in the cascode topology can easily saturate. The present system was simulated on an IBM SiGe5AM design kit. In the high gain mode, the power dissipated is 2.8 mW. FIG. 2 illustrates an acceptable noise factor NF of 1.58 $S_{22}$ has the value of about −6.2 dB. $S_{11}$, $S_{12}$, and $S_{22}$ are each approximately −10 dB. FIG. 3 is a typical 50 ohm Smith Chart. FIG. 3 illustrates substantially constant S parameter behavior for minimum gain and the forward and output reflection coefficients $S_{11}$ and $S_{22}$ respectively. The proximity of the values to the Cartesian coordinates (1,0) illustrates that impedance matching the amplifier may be accomplished with reasonable ease. In FIG. 4, the third intercept point IIP3 of approximately minus 5 is illustrated. In FIG. 5, the circuit is demonstrated to have a K factor of greater than unity across a very wide frequency range of 1 MHz–10 GHz.

FIGS. 6–9 demonstrate simulated performance in low gain mode corresponding to the parameters illustrated in values of FIGS. 2–5 respectively. The second amplifier transistor 14 is turned on and the first amplifying transistor 11 is turned off. Power consumption was only 2.8 mW at VCC=1 volt. As seen in FIG. 2, the noise factor was 1.58 over a range of 900 MHz to approximately 1.0 GHz. $S_{21}$ is approximately 10 over this frequency range with acceptably low figures for input and output reflection, below 12 dB. The first transmission gain was also suitably low.

FIG. 3, which is a Smith chart, illustrates at S-parameter responses for minimum gain, input reflection coefficient, $S_{11}$ and output reflection coefficient $S_{22}$. In FIG. 3, we see that the third order intercept point is 2.1. FIG. 1 traces the K factor, $K_f$ remaining above a value of 1.45. When the K factor is greater than unity, the circuit will be unconditionally stable for any combination of source and load impedance. Therefore the circuit is illustrated to be stable.

Additionally, in both FIGS. 5 and 10, the K factor is always greater than unity. The stability B-factor is always greater than zero.

It should also be noted that a 20 dB radio frequency gain reduction in the low gain mode is achieved. This differential of gain in the low gain mode is useful to reduce effects of a large blocking signal transmitted to the RF receiver system in an attempt to jam desired inputs.

FIG. 10 is a chart illustrating nominal values of bus voltage V from to source 7, output current Idc, power Pdc, noise factor NF, gain, third intercept point IIP3, reverse transmission coefficient $S_{12}$, input reflection coefficient $S_{11}$ and output reflection coefficient $S_{22}$ for operation in the high gain (HG) and low gain (LG) modes In accordance with the method of the present invention, first and second power transistors are provided connected in the common emitter mode for high gain amplification and in the common collector mode for low gain amplification. In order to multiple a radio frequency input by a high gain, the low gain amplifier transistor is turned off and the high gain amplifier transistor is turned on. Both the amplifier transistors are coupled for receiving and input comprising a radio frequency signal. Further, this step of activating one amplifier transistor and turning off the other comprises switching bias current is connected to the bases of each said amplifier transistor. Additionally, it is desirable to create an open circuit in the path from the input port of the amplifier 31 to the input of the second transistor amplifier 14. This is done by switching the third switching transistor 50.

The foregoing will enable those skilled in the art to make many forms of amplifiers constructed in accordance with the present invention. Many specific structural departures and may be made from the present apparatus and modifications in the specific implementations of the steps may be made while still providing an amplifier topology and method constructed in accordance with the present invention.

What is claimed is:

1. A low-power, low-noise, dual gain amplifier comprising:

first and second amplifier transistors each coupled for receiving a radio frequency input, said first amplifier transistor comprising a high gain amplifier and connected for operating in common emitter mode, and said second amplifier transistor comprising a low gain amplifier and connected for operating in the common collector mode, said first and second amplifier transistors being connected for alternate activation.

2. The amplifier according to claim 1 further comprising first and second bias sources connected to the bases of said first and second amplifier transistors respectively and first and second switching transistors coupled across said first and second bias sources and switch biasing means for biasing said first and second switching transistors to opposite conductivity states, whereby one of said first and second amplifier transistors is activated while the other is inactivated.

3. The amplifier according to claim 2 further comprising a third switching transistor ac coupled between inputs to said first and second amplifier transistors, said third switching transistor coupled to said switch biasing means to control its conductivity state.

4. The amplifier according to claim 3 in which said switch biasing means biases said second and third switching transistors to a one conductivity state and said first switching transistor to an opposite conductivity state and wherein the collector of said first amplifier transistor and the emitter of said second amplifier transistor are connected to an output terminal of said amplifier.

5. The amplifier according to claim 4 wherein said switching transistors comprise MOSFET transistors and said amplifier transistors comprise heterojunction bipolar transistors.

6. The amplifier according to claim 5 wherein said first and second amplifier transistors comprise N-P-N transistors.

7. A method of amplifying a radio frequency signal at a selected gain level comprising the steps of providing first and second amplifier transistors for coupling to the signal, said first and second amplifier transistors being connected in the common emitter and the common collector modes respectively, selectively alternately activating said first and second amplifier transistors and amplifying the signal at a high gain with said first amplifier transistor and multiplying said the signal at a low gain with said second amplifier transistor.

8. A method according to claim 7 wherein the step of alternately activating comprises switching bias currents connected to the bases of said first and second amplifier transistors.

9. A method according to claim 7 wherein the step of alternately activating further comprises opening or closing an ac path between the inputs of the first and second power transistors.

10. The method according to claim 7 wherein the step of providing said first and second amplifier transistors comprises providing first and second N-P-N transistors.

* * * * *